United States Patent [19]

Kirn

[11] 4,404,526
[45] Sep. 13, 1983

[54] HIGH FIDELITY AUDIO ENCODER/AMPLIFIER

[76] Inventor: Larry J. Kirn, 24614 Walden Rd. West, Southfield, Mich. 48034

[21] Appl. No.: 230,397

[22] Filed: Feb. 2, 1981

[51] Int. Cl.³ .............................................. H03F 3/38
[52] U.S. Cl. ...................................... 330/10; 330/59; 330/251; 330/308
[58] Field of Search ............... 330/10, 59, 207 A, 251, 330/308

[56] References Cited

U.S. PATENT DOCUMENTS 3,585,517 6/1971 Herbert .................................. 330/10
4,117,411 9/1978 Goble .............................. 330/251 X
4,162,455 7/1979 Birt .................................. 330/251 X Primary Examiner—James B. Mullins
Attorney, Agent, or Firm—Harry R. Dumont

[57] ABSTRACT

An encoder/amplifier giving low distortion, low noise, high power operation. A pair of 180° displaced sawtooth signals are generated from a fixed frequency clock and compared to an undistorted audio input signal. A constant current source and a pair of balanced capacitors are used in this input stage to provide self-nulling of noise. Optical isolation is used between the input encoder and power output stages to eliminate any ground noise occurring on the audio input lines and obviate the need for a large DC power supply transformer.

9 Claims, 2 Drawing Figures

HIGH FIDELITY AUDIO ENCODER/AMPLIFIER

BACKGROUND OF THE INVENTION

In audio encoding and processing applications, prime importance is given to elimination of transfer non-linearities, noise injection and phase non-linearities.

In power amplifier applications, it is important to drive speakers and other output or transducer devices with relatively high power outputs. Use of devices which switch with extremely low rise and fall times serves to reduce output distortion as occurs in prior art devices. Non-linearities and noise in the input stage before comparator operation are nulled out by differential use of a pair of 180° opposed sawtooths having identical frequency and zero phase shift between them. Differential input is from a common, constant current source. It is possible to eliminate distortions caused by encoding and amplification of the audio signal as it is introduced to the encoder/amplifier. Signal "ground", a common unbalanced mode noise source, is referenced to average duty cycle of output to achieve the low frequency response of a DC system with negligible offset or noise injection.

DESCRIPTION OF THE PRIOR ART

A number of encoder/amplifiers are known in which the audio input to the comparators is passed through one or more amplification input stages. The use of such amplifiers or inverters causes non-linearities and noise in the system.

One representative amplifier system is shown in U.S. Pat. No. 3,629,616 issued to N. E. Walker on Dec. 21, 1971 for "High Efficiency Modulation Circuit for Switching-Mode Audio Amplifier". That patent teaches the use in an amplifier of two 180° out-of-phase signals. These signals, however, are generated from the audio signal itself and then applied to first and second comparators. In the circuit of the present invention, the out-of-phase signals are produced by a fixed frequency clock source and a constant current source arrangement. Comparison is subsequently made to the undistorted, unaltered audio signal which is fed directly into the comparator stage. Non-linearities or noise in the comparison ramp are nulled by a differential output.

SUMMARY OF THE INVENTION

This invention relates to an encoder/amplifier capable of accepting an audio signal input and processing it in a high-efficiency modulation circuit. It is useful in encoding, modulation, amplification and transmission applications. The circuit is designed to avoid non-linearities and noise. It incorporates no active components in the audio signal path to the comparator. Comparator reference inputs are differential single-source to null noise and distortions. Extremely high effective input/output isolation is provided for encoder operation. The amplifier output stage coupled to the load i.e. the speaker includes V-MOS transistors connected in complementary pairs and capable of extremely high speed, high current operation.

BRIEF DESCRIPTION OF THE DRAWINGS

The present invention will now be described in the accompanying specification and in the drawings, in which.

DETAILED DESCRIPTION OF THE PREFERRED EMBODIMENT

Figure 1:
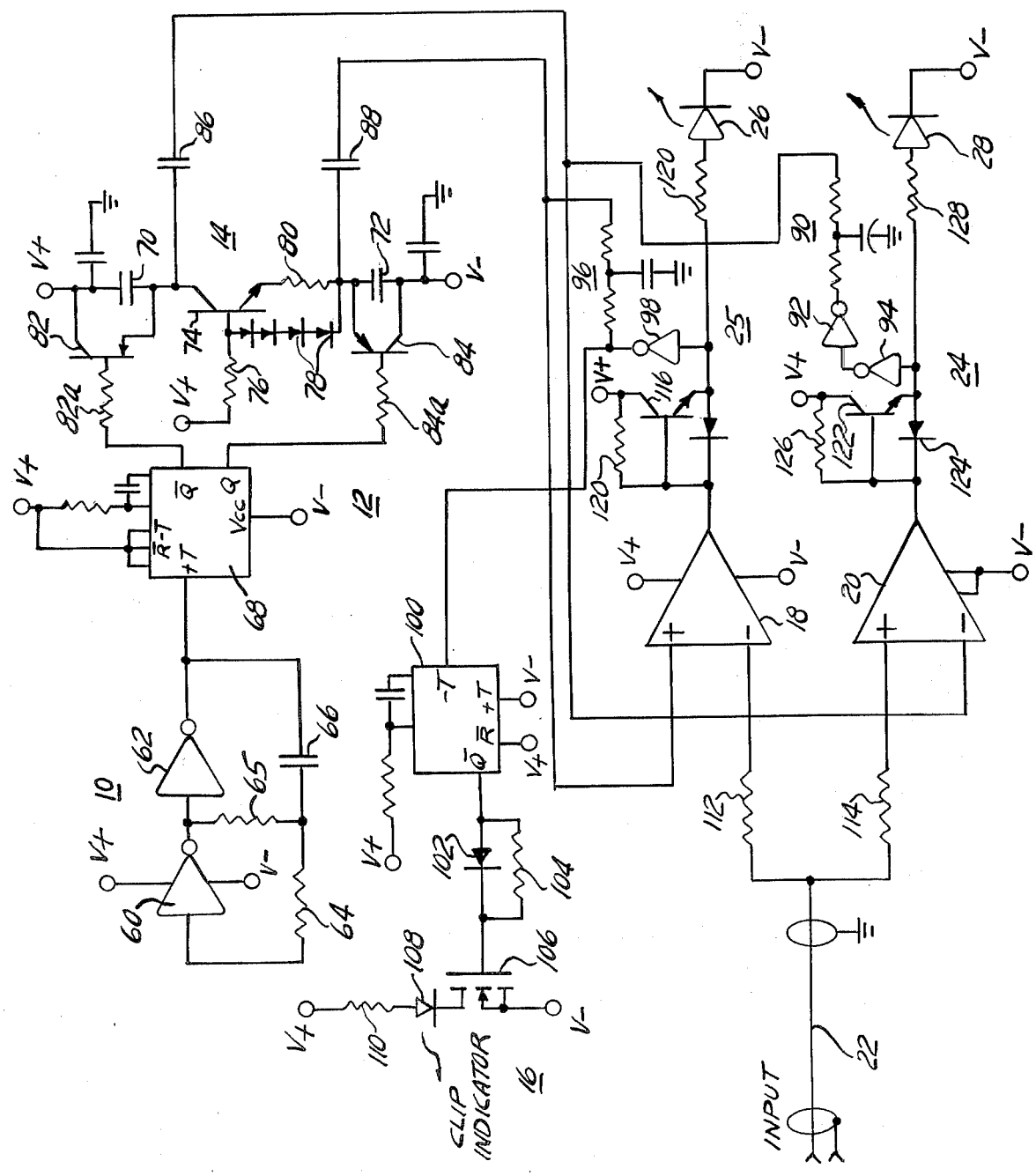
FIG. 1 is a combined diagrammatic and schematic drawing showing the encoder/amplifier input stage.

FIG. 1 shows the basic parts of the encoder/amplifier input stage. These include a fixed frequency oscillator 10, a one-shot multivibrator 12 and a self-nulling circuit 14.

Also included is a clip indicator circuit 16 found at the left hand side of the drawing. A pair of comparators 18 and 20 are shown receiving a separate audio input through a shielded input line 22. The comparators are shown connected to the output LED devices 26, 28 which are coupled as the input of the FIG. 2 output stage in the manner shown through optical-input inverter amplifiers 30, 32. Filter stages 24 and 25 convert comparator output duty cycles to DC levels which become the comparators' DC bias levels. This eliminates ground noise and nulls input stage DC offset voltages.

A pair of NAND gates 34, 36 are connected to a protection circuit 38 which operates as an output disable circuit in the event of overload or other undesired condition. The output stages include upper and lower V-MOS drive transistor pairs 40 and 42.

The final output stage of the circuit includes upper complementary transistor pair 44 and lower complementary pair 46 in N-Channel and P-Channel configurations as shown. The outputs of the two respective complementary pairs are provided through shielded, twisted pair leads 50, 52 to the load or output device, in this case a speaker 54.

Diodes D-1 are operatively connected to the transistor pairs 44 and 46 to hold their bias to a safe range and to prevent drift. The resistors in parallel with these diodes establish the DC bias level since the gates are capacitive and would otherwise float.

With respect to the FIG. 1 drawing, it will be seen that the fixed frequency oscillator 10 includes a pair of balanced voltage sources to eliminate ground current, a pair of inverters 60, 62, a pair of resistors 64, 65 and a capacitor 66. The output of the oscillator 10 is passed on to a one-shot multivibrator 68. The one-shot multivibrator 68 has a Q and a $\overline{Q}$ output which are simultaneously triggered. In the next following self-nulling stage 14 there is included an upper capacitor 70 and a lower capacitor 72. Intermediate the two capacitors there is connected a constant current source including a transistor 74 having its base connected to a plus voltage source through a resistor 76. A string of bias diodes 78 and a resistor 80 are coupled in circuit as shown. The capacitors 70 and 72 each have connected across them a respective discharge transistor 82, 84. The bases of these transistors are connected through resistors 82a and 84a, respectively, to the $\overline{Q}$ and Q outputs of the one-shot multivibrator 68. The outputs from self-nulling stage are through coupling capacitors 86 and 88 as shown. The output from the capacitor 86 is provided to comparator 20. The output from the capacitor 88 is passed to comparator 18. Inverters 92, 94 and 98 provide output duty cycles to filters 90 and 96 which convert duty cycle to DC bias for their respective comparators. This has the effect of a self-nulling input stage bias. A suitable RC network is provided for the one-shot multivibrator 100. The Q output of the one-shot multivibrator 100 is connected to a diode 102, resistor 104 shunt network to activate a V-MOS transistor 106 and an LED 108 associated with it. Plus and minus voltage sources are connected to the circuits and a resistor 110 is included as shown. It is the function of the clip indicator stage 16 to indicate whether there is overlap between the two phases which should both switch within one period of oscillator 10. The check is made within the period of a clock pulse to verify that the out-of-phase signal goes to zero within the duration of one clock period.

The next elements in the input stage are the upper comparator 18 and the lower comparator 20. The upper comparator 18 receives an input of an AC-coupled sawtooth wave at its upper, non-inverting input terminal. The lower comparator 20 received, AC-coupled, the other sawtooth wave 180° out-of-phase with the first at its lower, inverting input terminal. DC levels for both above-mentioned inputs are inversely or directly related to the average duty cycles of the respective comparator outputs. A pure audio input is received through lead 22 and passed through series resistors 112, 114 respectively to the upper inverting and lower non-inverting input terminals of the comparators 18 and 20. Next following the comparator 18 is a totem pole driver transistor 116. Associated with it are a turn-off diode 18 and a resistor 120. The output signal from the emitter of the transistor 116 or diode 118 anode is passed through a signal resistor 120 to the next following opti-coupling stage including the LED 26. In a like manner, there is provided for the output of the comparator 20 a transistor 122 having associated with it a turn-off diode 124 and a resistor 126. The output from the emitter of the transistor 122 or diode 124 anode is passed through a signal resistor 128 and thence to the LED 28 of the following opti-coupling stage.

Figure 2:
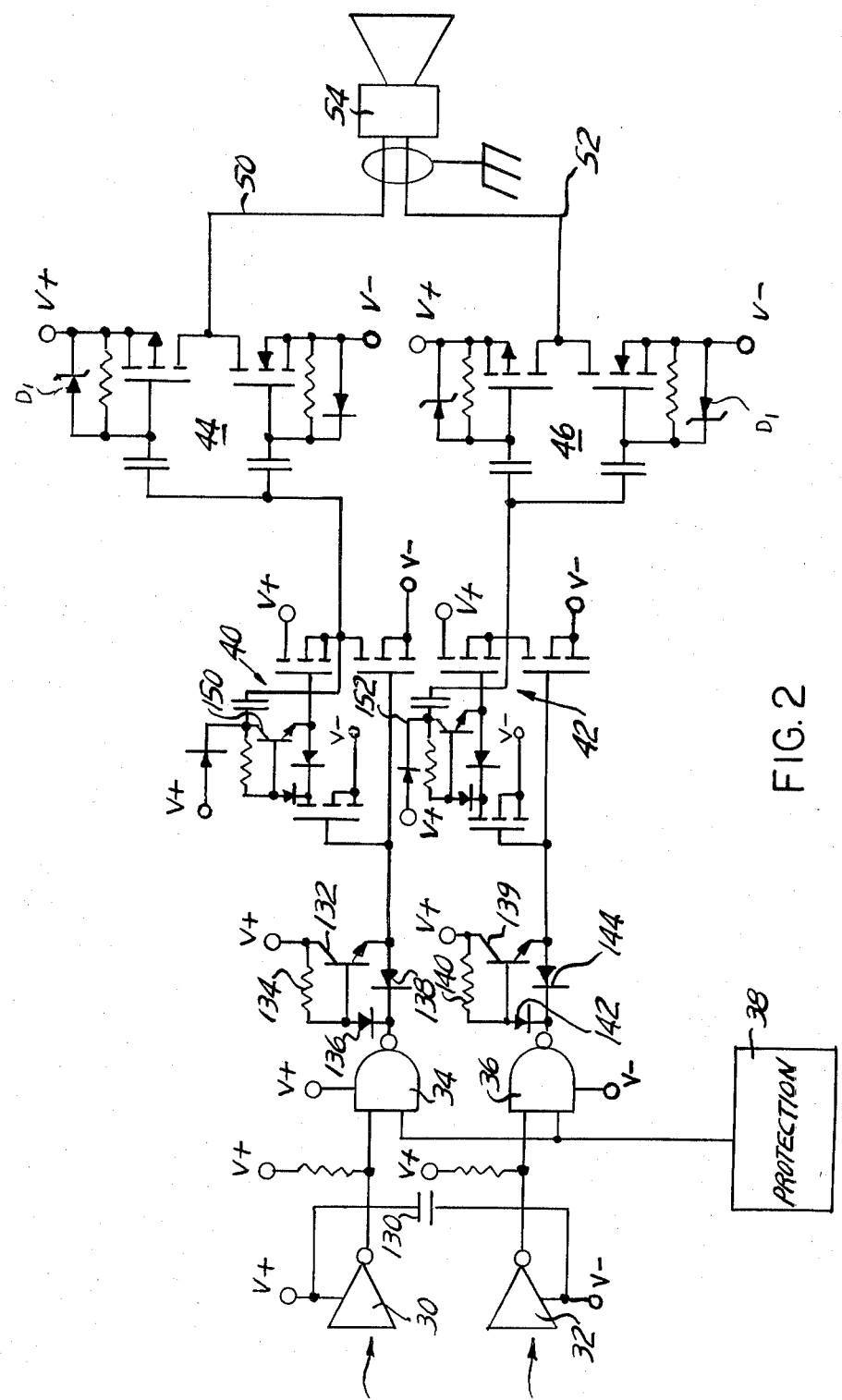
FIG. 2 is a combined diagrammatic and schematic showing of the amplifier output stage and speaker or load device.

Reference is now made to the FIG. 2 drawing showing the output stage of the amplifier. The opti-coupling stage output is passed through inverters 30 and 32 as shown. A capacitor 130 and DC voltage sources are further connected in circuit as indicated. Signals are then passed to the respective upper input terminals of the following NAND gates 34, 36. The protection circuit 38 is operably connected to the respective lower input terminals of the aforementioned gates to provide turn-off in the event over-current, zero load, or other undesired condition is present. The output from the upper NAND gate 34 passes through an amplifying transitor 132 with resistor 134 and diodes 136, 138 connected in circuit as illustrated. The second amplifying transistor 139 is connected to the output of the lower gate 36. The transistor 139 further has a resistor 140 and diodes 142 and 144 connected in circuit with it as shown.

Next following in the two branches are V-MOS transistor pairs 40 and 42. Totem-pole driver circuits are included which provide transistor 150 for V-MOS transistor pair 40 and transistor 152 for V-MOS transistor pair 42. Appropriate plus and minus voltage sources are connected to the sources and drains of the aforementioned transistor pairs 40, 42 in a manner well known in the art.

The final output stage elements include a pair of V-MOS transistors of the P and N channel type connected in upper complementary pair 44. Appropriate biasing networks and DC sources are coupled in circuit as shown. The second complementary pair of V-MOS transistors 46 similarly poled are connected in circuit with the output of V-MOS transistor pair 42. The incorporation of the AC coupled complementary pairs permits high voltage gain, high speed, high current output through leads 50 and 52 to the load which in this case is the speaker 54.

DESCRIPTION OF OPERATION

It will be seen that the present invention provides an arrangement in which a constant frequency oscillator is used to provide two identical sawtooth waveform outputs, one out-of-phase with the other by exactly 180°. This relationship is made possible by the incorporation in the FIG. 1 circuit of the self-nulling stage 14 which included the constant current source associated with the transistor 74 and upper and lower capacitors 70 and 72.

The two sawtooth waveforms are compared in the following comparator stage including comparators 18 and 20 to a pure and undistorted audio input introduced through the lead 22. This means that there is provided no inversion, amplification or distortion of the audio input signal itself. By the present invention, the two 180° opposed sawtooths, because of the constant current source connected between the capacitors 70 and 72, serve to null out any non-linearities or noise that otherwise would arise.

It is also important to note that the signals are passed through the opti-coupling stages 26, 28 to eliminate any ground noise that might have been present on the audio input lines. Plus and minus logic supplies ensure that only signal related ground currents can flow. The final output signals to the load such as speaker 54 are passed through complementary pairs of V-MOS transistors 44, 46. These provide extremely high speed and high current amplification and give a differential output to the load. The transient IM distortion is negligible because of the manner in which the 180° out-of-phase signals are generated and controlled and the manner in which the audio signal is used as an input without any amplification or inversion. Opti-coupling allows in/out isolation and obviates the output power supply transformer.

It will thus be seen that I have provided by my invention a greatly improved audio encoder/amplifier eliminating noise and distortion and operable with a high efficiency as compared to the prior art devices.

I claim:

1. An audio encoder/amplifier for coupling, modulating and amplifying an audio signal and providing it to operate a speaker or other load device, comprising: an audio input terminal; means for generating two common source complementary signals, one positive going and the other negative going, including a pair of capacitors, each connected to a common constant current source; comparator means for comparing each of said complementary signals to said audio input signal and producing two pulse width modulated output signals; and switching means having its input connected to said output signals and operably connected to said load device for operating it with relatively high current and high speed.

2. The combination as set forth in claim 1 wherein said means for generating said two complementary signals comprises a fixed frequency pulse source and a one-shot multivibrator.

3. The combination as set forth in claim 1 wherein said means for generating said two complementary signals includes a pulse train source and means for developing said signals from said train.

4. The combination as set forth in claim 1 wherein said switching means comprise a plurality of V-MOS transistors connected in complementary pairs for operating said load.

5. The combination as set forth in claim 1 wherein said means for generating said complementary signals includes a fixed frequency oscillator and a dual one-shot multivibrator.

6. The combination as set forth in claim 1 wherein said input terminal is connected to the inputs of said comparator means through a series resistor.

7. The combination as set forth in claim 1 wherein said load is connected to output stage of said switching means through an opti-coupling stage.

8. The combination as set forth in claim 1 wherein a DC audio input coupling stage is included with DC bias levels determined by said comparator outputs.

9. The combination as set forth in claim 1 wherein said switching means includes in its direct input a shelf-biased capacitive input stage.

* * * * *